United States Patent
Droz

(10) Patent No.: US 6,971,581 B2
(45) Date of Patent: Dec. 6, 2005

(54) ELECTRONIC LABEL

(75) Inventor: François Droz, La Chaux-de-Fonds (CH)

(73) Assignee: NagraID S.A., La Chaux-de-Fonds (CH)

( * ) Notice: Subject to any disclaimer, the term of this patent is extended or adjusted under 35 U.S.C. 154(b) by 3 days.

(21) Appl. No.: 10/168,087

(22) PCT Filed: Dec. 22, 2000

(86) PCT No.: PCT/IB00/01952

§ 371 (c)(1),
(2), (4) Date: Jun. 17, 2002

(87) PCT Pub. No.: WO01/48687

PCT Pub. Date: Jul. 5, 2001

(65) Prior Publication Data

US 2002/0190131 A1 Dec. 19, 2002

(30) Foreign Application Priority Data

| Dec. 23, 1999 | (CH) | ................................. 2361/99 |
| Jan. 28, 2000 | (CH) | ................................. 0167/00 |
| Feb. 3, 2000 | (CH) | ................................. 0216/00 |

(51) Int. Cl.$^7$ ............................................ G06K 19/06

(52) U.S. Cl. ...................... 235/492; 235/386; 235/488

(58) Field of Search .............................. 235/492, 472, 235/383, 385, 488, 486

(56) References Cited

U.S. PATENT DOCUMENTS

| 5,013,900 | A | * | 5/1991 | Hoppe ........................ 235/492 |
| 5,519,201 | A | * | 5/1996 | Templeton et al. ......... 235/492 |
| 5,844,244 | A | | 12/1998 | Graf et al. |
| 5,851,854 | A | * | 12/1998 | Haghiri-Tehrani et al. .. 438/118 |
| 6,027,027 | A | * | 2/2000 | Smithgall ................... 235/488 |
| 6,100,804 | A | * | 8/2000 | Brady et al. ............. 340/572.7 |
| 6,142,381 | A | * | 11/2000 | Finn et al. .................. 235/492 |
| 6,255,951 | B1 | * | 7/2001 | De La Huerga ......... 340/573.1 |
| 6,290,138 | B1 | * | 9/2001 | Ohno et al. ................. 235/492 |
| 6,371,380 | B1 | * | 4/2002 | Tanimura .................... 235/492 |
| 6,386,459 | B1 | * | 5/2002 | Patrice et al. ............... 235/492 |
| 6,431,455 | B1 | * | 8/2002 | Ponert ........................ 235/492 |
| 6,484,945 | B1 | * | 11/2002 | John et al. .................. 235/487 |

FOREIGN PATENT DOCUMENTS

| DE | 19613491 A | 10/1997 |
| EP | 0288676 A | 11/1988 |
| FR | 2689663 A | 10/1993 |
| WO | WO 93 12513 A | 6/1993 |

* cited by examiner

Primary Examiner—Diane I. Lee
Assistant Examiner—Seung H Lee
(74) Attorney, Agent, or Firm—Sturm & Fix LLP

(57) ABSTRACT

Electronic labels consist of an electronic chip (4) and an antenna (3) assembled on a flexible support (2). The electronic chip (4) needs a rigid zone in order to not be damaged. This is why it is generally covered with a resin that makes this rigid region bigger. In order to reduce this zone the resin that covers the chip is suppressed and replaced with a protection (5) ensured by a rigid element added to the flexible support (2).

14 Claims, 3 Drawing Sheets

ELECTRONIC LABEL

The present invention concerns an electronic label, particularly a flexible electronic label.

By electronic label we understand an assembly that comprises at least a flexible support, an antenna, and an electronic chip. This assembly can comprise several antennas or several chips according to the needs. We find them in the form of a button, in smart cards, even in baggage labels. Thanks to their antennas they can communicate with a distant reader. The antenna not only serves as a means of communication but can also serve to produce the energy that is necessary to supply the electronic chip.

According to the embodiments the antenna is added on the flexible support or directly engraved or cut on the same support.

There are numerous chips that differ in their functions, for example some of them only allow the reading of information while others allow the memorization and the modification of their memory. The latter are used amongst other purposes for electronic purse applications, that well understood has to be diminished depending on the consumption of the user.

The subject of the present invention concentrates particularly on flexible electronic labels. We find them in the bracelets of show tickets or of badges, even imbedded in the material of clothes. They can be added to an object such as a piece of clothes or take the form of the object, for example the flexible support working as a bracelet.

If the antennas manufactured in an assembly of thin copper wires are easily bent and twisted, the electronic chip itself needs a rigid zone for its implantation. In fact, the silicon chip is fragile and this is why it is embedded in a resin that will protect it from mechanical aggressions and chemical attacks (corrosion). This resin will also protect the contacts between the chip and the antenna.

This is why the zone of the chip is a region that cannot be folded so as to not break the chip or its contacts. This zone can be of about 5 to 7 mm of diameter due to the embedding of the chip. The embedding of the chip is a supplementary operation to the manufacturing and makes the cost of such a label more expensive.

The objective of the present invention is on the one hand to reduce the rigid zone on a flexible support and at the same time ensuring the protection of the chip.

This objective is achieved by a flexible electronic label that comprises at least one flexible support, an antenna, and an electronic chip, said chip being assembled on the flexible support and connected to the antenna. This label is characterized by the fact that the protection of the chip is ensured by a rigid element added to the support.

In this way, it is no longer the embedding of the chip that ensures its rigidity but a rigid element that is placed either on top or under the chip. This element can serve advantageously as a decorative element.

A rigid element can be for example an extension of a rigid element already assembled on the flexible support, such as a fixation element or fastener. In this way the fastener of a bracelet can be extended to cover the chip that is assembled on the flexible part of the bracelet. This is applied to all types of fasteners, be it a watch bracelet with a tongue or a fastener for single use for a hospitalized person. There is always a rigid part that can work as a protection for the chip.

In the absence of a fastener this rigid element can also take the form of a rigid dome that is independent and that covers the lodging of the chip, on either of the faces of the flexible support, and that has feet that cross this flexible support to engage a plate to this effect.

According to another embodiment the rigid dome is placed under the electronic chip.

Other forms or means of assembly can be imagined, such as gluing, welding, or the hot deformation of the foot.

In certain applications it can be interesting to assemble the chip later, even to change it according to the needs. For this the present invention is equally applied to a rigid element that includes the electronic chip, the latter connecting on the antenna by means of trays of contacts foreseen to this effect.

The invention will be better understood with the help of the following detailed description that refers to the annexed figures, which are given as a non-limiting example, in which.

Figure 1:
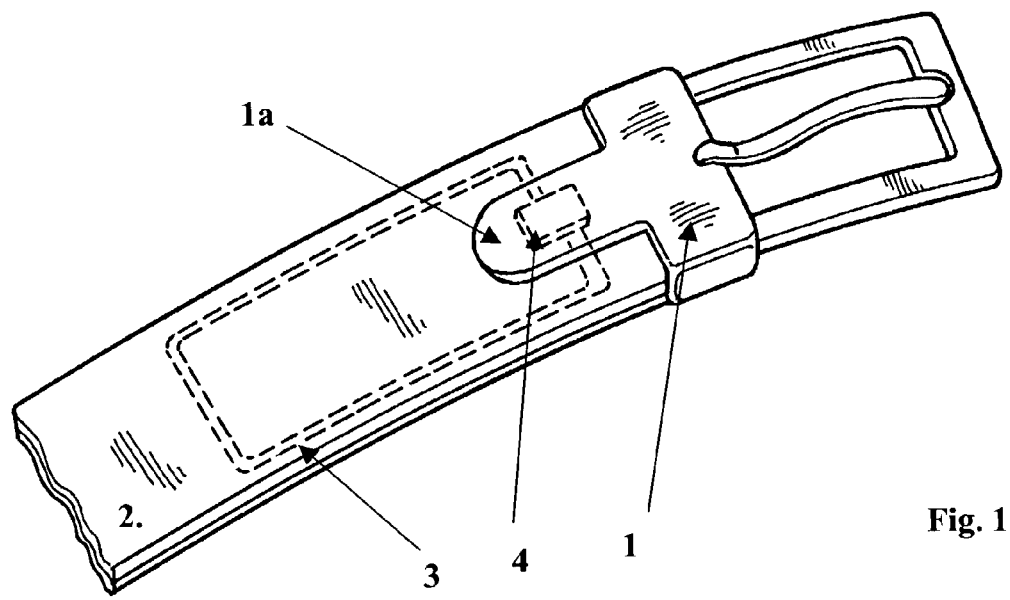
FIG. 1 represents a bracelet with a fastener with a tongue that includes an electronic label according to the invention.

In FIG. 1 we can distinguish in pointed dots the antenna 3 included in the flexible bracelet 2. The antenna is generally realized between two layers of tissue to protect it mechanically. The electronic chip 4 is placed along the antenna 3 and is connected to the latter generally by two gold wires. The fastener 1 is rigid and in this example has a protuberance 1a that covers the place where the chip 4 is placed.

Other forms of fasteners can be used for example with a clip of which one part will be prolonged to be placed just on top of the electronic chip.

When using a low cost bracelet the latter may only have one single layer; the antenna and the electronic chip are applied on the inside of the bracelet according to the invention, a part of the fastener covers the electronic chip.

Figure 2:
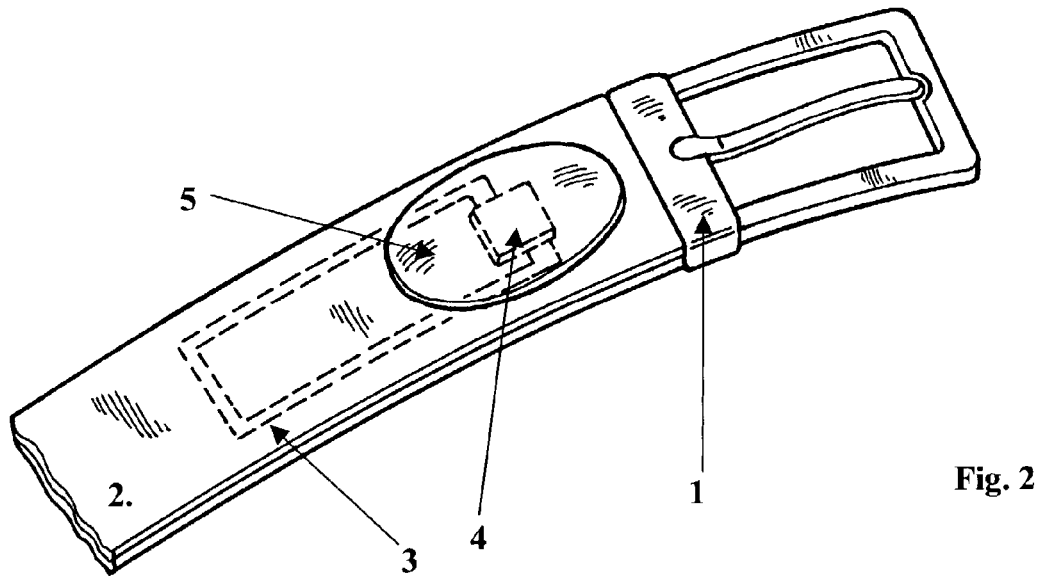
FIG. 2 represents a flexible bracelet that includes an electronic label and an added rigid element.

FIG. 2 shows an execution in which we do not want to use a part of the fastener 1 to protect the chip 4. In this case we use an element 5 that is added on top of the chip 4. This element 5, here in the form of a dome, is applied on the flexible support 2. We will perceive that it can be maintained in several ways, either by gluing or hot gluing, or by engagement. This dome can also serve as a publicity support, for example having the form of the firm's logo.

This way of assembling the electronic label is applied to every flexible support and is not limited to bracelets. We can incorporate such an assembly in a plane or theatre ticket, inside a piece of clothes, in a number on a runner's back.

Figure 3:
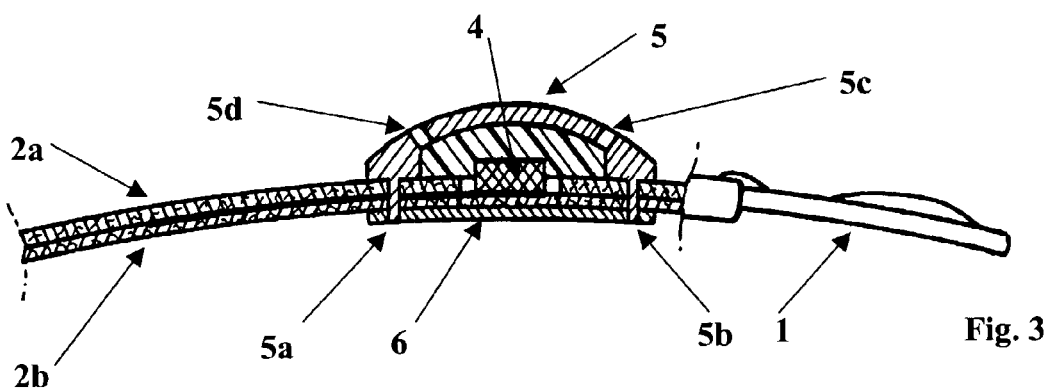
FIG. 3 represents a cross section view of the flexible bracelet of FIG. 2.

FIG. 3 shows us a cross section of an example of execution of such a rigid element. We can distinguish the top part of the dome 5 that has two feet 5a and 5b that cross the flexible support 2 to engage in a plate 6. The flexible support 2 is composed of a top layer 2a and a bottom layer 2b. The antenna 3 is placed between these two layers and is connected to the electronic chip 4. In a form of execution that is not represented, the top layer covers the electronic chip. In another embodiment such as represented in FIG. 3, the top layer has an orifice that lets the electronic chip 4 pass. The latter configuration allows obtaining a reduced thickness.

According to another embodiment the dome 5 has two orifices 5c and 5d destined to fill the space on the chip 4 with a filling material such as an epoxide resin or a silicone. This presents the advantage of protecting the chip 4 from the corrosion due to humidity, the transpiration, or from corrosive cleaning agents. The resin is injected through a first orifice 5c and when the space under the dome 5 is filled the excess resin comes out again through the orifice 5d.

According to an embodiment of this execution the dome 5 is previously filled with a drop of resin before being put in place. The excess resin escapes through an orifice foreseen to this effect.

Figure 4:
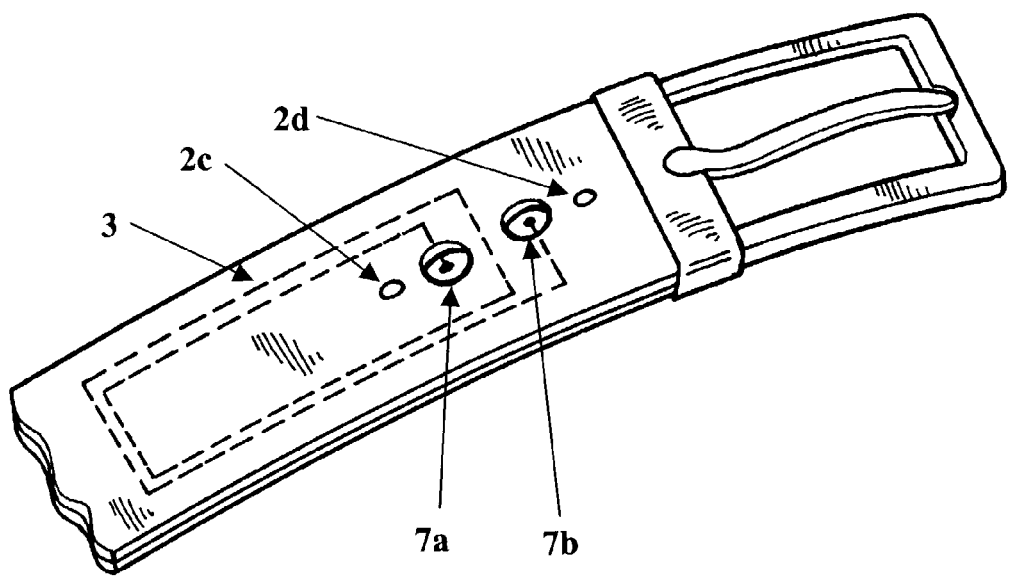
FIG. 4 represents an antenna of an electronic label on which can be connected an electronic chip.

FIG. 4 shows an execution of a flexible support 2 that includes the antenna 3 but without the electronic chip 4. The flexible support 2 lets appear two zones 7a and 7b in which the two conductive ends of the antenna 3 are accessible. According to the needs these zones are coated with a conductive material (gold, aluminium, copper, or carbon). In order to facilitate the assembly, two orifices 2c and 2d destined to the assembly are placed on both sides of the recesses.

Figure 5:
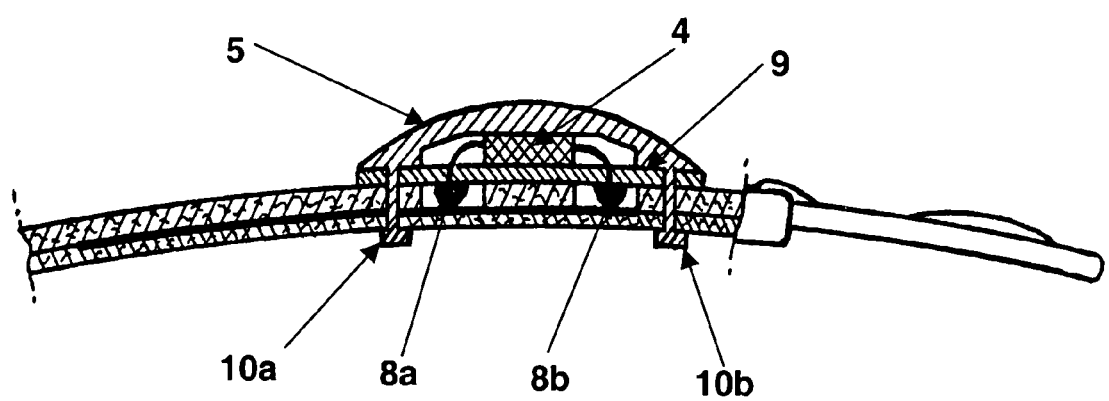
FIG. 5 represents the assembly of an electronic chip that contacts on the antenna that is assembled on a flexible support.

The assembly of this execution is illustrated in FIG. 5. The rigid element 5 comprises the electronic chip 4. Thus, it is by the action of placing the protection 5 that the chip will be in contact with the antenna and the label thus becomes operative. To this effect, according to one embodiment, the rigid element 5 comprises a substrate 9 on which is placed the electronic chip. Also on this substrate, we find the two conductive lines 8a and 8b that are placed in front of the two recesses 7a and 7b linked to the antenna 3. These lines can be realised by deposits of carbon for example. The assembly of the rigid element 5 by the feet 5a and 5b crossing the flexible support is advantageous as it ensures at the same time the positioning of the contacts between the antenna and the chip.

In or to improve the stability and the electric conductiveness between the chip and the antenna a conductive glue can be applied to the contacts serving as a conductive binding agent.

Other forms of execution of the chip do not need the presence of the substrate 9. Electronic chips are known, named "face-down", that include reliefs destined to the connection. Thanks to these reliefs the chip can be directly applied on the flexible support and thus be connected to the antenna. According to another embodiment it is known to apply a conductive film on the chip, a film that ensures the conduction between the chip and the antenna. The conductive zones are outlined in this type of execution by thermal processing.

According to an embodiment of this execution the rigid element 5 comprises accessories such as a battery, a vibrator, a LED or transducer for the applications of this label.

The bracelets for single use are used for applications such as the control of access to shows or the identification of a hospital patient. They are conceived so that the opening of such a bracelet can only be done by destroying it. In this view, it is important that the authentication done by the electronic label can equally be interrupted with the same title as the visual authentication.

According to an embodiment the fastener, of which a part covers the electronic chip, is disposed to destroy the chip or the antenna in case of an attempt of opening. For this purpose several embodiments can be used.

According to a first embodiment the part of the fastener that covers the chip is glued to the latter. In this way, in case of a forced opening of the fastener the electronic chip is torn from its flexible support and, without contact with the antenna, it can no longer work. The glue that keeps the chip on the flexible support has a lower adhesive power than the glue that binds the chip to the fastener.

According to a second embodiment the part of the fastener that protects the chip has two spigots that cross the flexible bracelet. The orifices of the flexible bracelet are brought nearer and between them passes at least one of the conductors of the antenna. The two spigots are widened at their ends in order to prevent them from coming out again. This function is ensured either by pieces added by engagement or obtained by deformation of the spigot, for example by heating.

During an attempt of forced opening the spigot cannot escape from its orifice without producing the tearing of the passage between the two orifices and thus produces the definitive interruption of the antenna, and consequently the label is no longer operative.

Although this type of security is well adapted to the aggressions directed against the fastener there always exists for the fraudster the possibility of cutting the bracelet to transmit it to a third person who will thus be able to identify him/herself thanks to the electronic function of the label.

In order to prevent this type of maneuver we propose according to a particular embodiment of the invention that at least one turn of the antenna is displayed along all the length of the electronic label. In this way it is not possible to cut this type of bracelet without interrupting the antenna, and thus the functioning of the electronic module.

It is not necessary that all the antenna is displayed along the length of the bracelet; it is enough that one turn passes from one of the parts of the fastener to the other without leaving a passage allowing the interruption of the bracelet.

According to an embodiment of this execution the electronic chip has two connections that must imperatively be linked between themselves to allow the functioning of this chip. These two connections are linked to a conductor that goes along the length of the electronic label and that guarantees that any cutting of this electronic label produces invariably the interruption of the conductor, and consequently the stopping of the chip.

This same function of the conductive wire can be used to voluntarily render the label inoperative. We can imagine a plane ticket of which one part is scored but lets pass the conductive wire. During the validation of said ticket the operator cuts the coupon at the foreseen place to this effect and produces the interruption of the conductive wire. This operation renders the electronic module inoperative.

This part destined to the separation can be obtained by scoring or by weakening of a region of the label. In fact, the thickness of the flexible support can be reduced in order to facilitate the later cutting at this place.

What is claimed is:

1. A flexible electronic label comprising at least a flexible support, an antenna, and an electronic chip, said chip being rigidly assembled with said flexible support and connected to the antenna, a rigid non-removable element disposed on at least one face of the support and above and/or underneath the chip, said rigid non-removable element being disposed in such a way that said element has a larger extent than an extent occupied by the chip alone and that said element is fixed on an area of said flexible support surrounding said chip.

2. The electronic label according to claim 1, wherein the rigid non-removable element is a part of an element that serves as a closing element or fixation of the label.

3. The electronic label according to claim 1, wherein the rigid non-removable element is an independent element serving as protection for the chip.

4. The electronic label according to claim 3, wherein the independent element is assembled on the flexible support by gluing, welding, or by engagement.

5. The electronic label according to claim 1, wherein at least one conductive wire is displayed along all a length of said label and whose interruption causes a cessation of functioning of said label.

6. The electronic label according to claim 5, the at least one conductive wire is a part of the antenna.

7. The electronic label according to claim 5, the at least one conductive wire is linked by two ends of the at least one conductive wire to the electronic chip.

8. The electronic label according to claim 5, the at least one conductive wire crosses a separation zone with reduced solidity.

9. The electronic label according to claim 1, wherein the rigid element has means to produce a destruction of the chip and/or the antenna during the separation of the said rigid non-removable element from the flexible support.

10. The electronic label according to claim 9, the means comprise a glue placed between the chip and the rigid non-removable element, an adhesive power of the glue is greater than that of a binding agent placed between the chip and the flexible support.

11. The electronic label according to claim 9, wherein the flexible support has a least two orifices between which passes at least one conductor of the antenna, at least two spigots that are connected to the rigid non-removable element and that cross said orifices, said spigots being widened at spigot ends either by adding a piece or by deformation.

12. The electronic label according to claim 1, wherein a space is provided between the inner face of the rigid non-removable element and the chip.

13. The electronic label according to claim 12, wherein the space between the inner face of the rigid non-removable element and the chip is filled with an epoxy resin filling material.

14. The electronic label according to claim 12, additionally comprising a silicone filling material in the space between the inner face of the rigid non-removable element and the chip.

* * * * *